(12) United States Patent
Yabata et al.

(10) Patent No.: US 6,335,275 B1
(45) Date of Patent: Jan. 1, 2002

(54) METHOD FOR FORMING CONTACT HOLES AND SEMICONDUCTOR DEVICE FABRICATED USING THE SAME

(75) Inventors: Atsushi Yabata, Tokyo; Masaki Ogata, Chofu, both of (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/417,548

(22) Filed: Oct. 14, 1999

(30) Foreign Application Priority Data

Oct. 19, 1998 (JP) .......................... 10-296773
Apr. 2, 1999 (JP) .......................... 11-096415

(51) Int. Cl.⁷ .......................................... H01L 21/4763
(52) U.S. Cl. ................................................ 438/639
(58) Field of Search .................... 438/640, 618, 438/634, 637, 638, 647, 668, 669, 671, 675, 680, 700, 706, 712, 714

(56) References Cited

U.S. PATENT DOCUMENTS 5,294,296 A  *  3/1994  Yoon et al. .................. 156/657
5,445,710 A  *  8/1995  Hori et al. ................. 156/643.1

FOREIGN PATENT DOCUMENTS

JP          10-65003         3/1998         ........... 21/768

OTHER PUBLICATIONS

S. Wolf adn R.N. Tauber, Silicon Processing, Lattice Press, vol. 1, pp. 556–557, 1986.*

* cited by examiner

*Primary Examiner*—David Nelms
*Assistant Examiner*—Quoc Hoang
(74) *Attorney, Agent, or Firm*—Rabin & Berdo, P.C.

(57) ABSTRACT

An insulating layer and a first silicon system layer are formed on a semiconductor substrate. An opening is formed in the first silicon system layer. A second silicon system layer is provided to cover the first silicon system layer and the opening. The second silicon system layer is etched to form a spacer on an inside wall of the opening so that the opening has a larger diameter at the top and a smaller diameter at the bottom. A protection layer is formed on the spacer; and the insulating layer is etched using the first silicon system layer, spacer and protection layer as a mask to form a contact hole therein.

21 Claims, 7 Drawing Sheets

SF$_6$/(SF$_6$+HBr) %

METHOD FOR FORMING CONTACT HOLES AND SEMICONDUCTOR DEVICE FABRICATED USING THE SAME

TECHNICAL FIELD OF THE INVENTION

The present invention generally relates to a semiconductor device and its fabrication processes, and in particular the present invention relates to a method for forming contact holes.

BACKGROUND OF THE INVENTION

In fabrication of semiconductor devices, contact holes have been formed using etching technology. In an etching process, a resist pattern is formed on a surface of a semiconductor substrate, then an oxide layer or polysilicon layer is etched using the resist pattern as a mask. These days, the major techniques for the etching process are dry etching and wet etching.

In a dry etching process, a particular layer is etched with a predetermined etching gas. In a wet etching process, a particular layer is etched with a chemical solution. In an etching process using a strip-shaped resist pattern as an etching mask, when the etching process progresses under the etching mask, a given pattern is formed to have a narrower width than that of the resist pattern (designed width). In an etching process using a groove-shaped resist pattern as the etching mask, when the etching process progresses under the etching mask, a given pattern is formed to have a wider width than that of the resist pattern (designed width). This kind of etching is called isotropic etching. In contrast, etching that does not progress under an etching mask is called anisotropic etching.

In a reactive ion etching process, a reaction gas is introduced into an etching chamber, which is under vacuum. When RF-power, for example, of 13.56 MHz, is applied to the reaction gas, plasma is generated in the etching chamber. In the etching chamber, active atoms and molecules, such as ions and radicals, are generated. For example, when $CF_4$ gas is introduced into the etching chamber, positive ions, such as $CF_3^+$ and $CF_2^+$, and radicals, such as $F^*$ and $CF^*$, are generated in response to the plasma.

A semiconductor substrate is put on a stage in the etching chamber. When a bias is applied to the semiconductor substrate, the electric field accelerates the positive ions so as to impact upon the surface of the semiconductor substrate. With the impact of the positive ion, the surface of the semiconductor substrate is decomposed. The decomposed particles react easily with radical of $F^*$ and $CF^*$, so the etching process progresses quickly. The ion impact progresses in a vertical direction to the semiconductor substrate, so that the reactive ion etching is recognized as anisotropic.

Recently, contact holes have been formed using the above described anisotropic etching technique. According to a conventional method, an oxide layer is deposited on a silicon substrate by a CVD (Chemical Vapor Deposition) technique. Subsequently, a polysilicon layer is deposited over the entire surface of the structure, and then a resist pattern is formed on the polysilicon layer. Next, the polysilicon layer is etched using the resist pattern as an etching mask to form an opening (base of a contact hole) therein. The etching process is carried out using a halogen system gas, such as $Cl_2$ or HBr.

Next, the resist pattern is removed, and then another polysilicon layer is deposited over the entire surface of the structure. The polysilicon layer is etched by an anisotropic etching process to form a sidewall of polysilicon inside the opening. The sidewall is be used as a spacer or mask in the next step.

Subsequently, the CVD oxide layer is etched by an anisotropic etching process using the polysilicon layer and sidewall as a mask to form a contact hole.

According to the above-described conventional method, the contact hole is tapered, having a wider opening area at the top and a narrow opening area at the bottom because the etching process is of anisotropic etching. That is because the polysilicon layer and sidewall are etched at an etching rate determined according to the ratio of etching rates between the CVD oxide layer and the polysilicon layer. The sidewall is etched while the CVD oxide layer is etched, so that the contact hole is tapered.

According to another conventional method, an oxide layer is deposited on a silicon substrate by a CVD (Chemical Vapor Deposition) technique. Next, a polysilicon layer is deposited over the entire surface of the structure by a CVD process, and then a resist pattern is formed on the polysilicon layer. Next, the polysilicon layer is etched using the resist pattern as an etching mask to form an opening (base of a contact hole) therein. The etching process may be anisotropic etching using a halogen system gas, such as $Cl_2$ or HBr.

Subsequently, the resist pattern is removed, and then a polysilicon layer is deposited over the entire surface of the structure. The polysilicon layer is etched by an anisotropic etching process to form a sidewall of polysilicon inside the opening. The sidewall is used as a spacer or mask in the next step. The CVD oxide layer is etched by an anisotropic etching process using the polysilicon layer and sidewall as a mask to form a contact hole.

According to the above-described conventional method, the contact hole is tapered, having a wider opening area at the top and a narrow opening area at the bottom. In this method, the polysilicon layer is etched to have a tapered cross section.

In recent years, as contact holes have been designed to be smaller, exhaustion characteristic of holdup gas becomes lower. Resist reaction products, including constituent elements of the resist layer, and etching reaction products, including constituent elements of the etching gas, holdup easily in the contact hole. Such reaction products are re-attached on the inside wall of the contact hole, so that the contact hole is overprotected.

Generally, a halogen system gas including Cl or Br does not react well with silicon, so that a higher bias is applied to the Cl ions and Br ions in the plasma to accelerate such ions. As a result, the ions are injected vertically to a polycrystalline silicon layer, and therefore, impact power of the ions is increased. Cl radicals and Br radicals, attached to the silicon layer, react with the silicon with energy received from the injected ions, and are removed from the substrate. In this case, the polysilicon layer is etched with the high-energy ions in a highly anisotropic manner, and at the same time, the ions are also injected onto the resist pattern.

Resist system products, hereinafter called "resist system sputter products", are generated in response to an impact of the ions. Etching reaction products on the silicon layer are deposited on the inside wall of the contact hole. The deposited products function as a mask in the etching process, and therefore, it can be understood that the opening (base of the contact hole) formed in the polysilicon layer is easily tapered. The shapes of contact holes may vary even though the contact holes are formed under the same etching process condition. This means that it is difficult to shape contact holes uniformly.

After a contact hole is formed in the CVD oxide layer, the polysilicon layer and sidewall are completely removed. Next, a titanium nitride layer is formed on the CVD oxide layer, and then a tungsten layer is formed on the titanium nitride layer by a CVD process to form a laminated layer. Subsequently, an etching back process is carried out upon the entire surface of the structure, and a tungsten plug is etched at a center (bottom), so that even the silicon substrate may be etched.

Next, an aluminum layer is deposited on the surface of the structure. In this process, a cavity is formed in the tungsten plug. Next, the aluminum layer is patterned. After that, an insulating layer (interlayer insulator film) and a passivation film are formed on the aluminum layer. The cavity is not filled with the insulating material. In later processes, such as thermal treatment or burn-in treatment after assembly, air in the cavity expands, and therefore, the tungsten plug may be broken. Such a problem results in a defective semiconductor device.

OBJECTS OF THE INVENTION

Accordingly, an object of the present invention is to provide an improved method for forming contact holes having inside walls that are not tapered. Another object of the present invention is to provide a semiconductor device that can be fabricated at a high yield rate.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an insulating layer and a first silicon system layer are formed on a semiconductor substrate. An opening is formed in the first silicon system layer. A second silicon system layer is provided to cover the first silicon system layer and the opening. The second silicon system layer is etched to form a spacer on an inside wall of the opening so that the opening has a larger diameter at the top and a smaller diameter at the bottom. A protection layer is formed on the spacer; and the insulating layer is etched using the first silicon system layer, spacer and protection layer as a mask to form a contact hole therein.

According to a second aspect of the present invention, an insulating layer and a first silicon system layer are formed on a semiconductor substrate; and the first silicon system layer is etched to form an opening therein. Next, a second silicon system layer is formed to cover the first silicon system layer and the opening; and a protection layer is formed over the second silicon system layer. Subsequently, the second silicon system layer and protection layer are etched to form a spacer on an inside wall of the opening so that the opening has an uniform diameter throughout top and bottom; and then the insulating layer is etched using the first silicon system layer and spacer as a mask to form a contact hole therein.

According to the present invention, contact holes are improved in shape, namely, it is prevented that the inside wall of a contact hole is tapered. Further, the reaction products can be formed in a series of etching process in an etching chamber. The reaction products are detached and exhausted automatically in the etching process; therefore any additional process and any additional time are not required to remove the reaction products.

DETAILED DISCLOSURE OF THE INVENTION

In the following detailed description of the preferred embodiments, reference is made to the accompanying drawings, which form a part thereof, and in which are shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and scope of the present invention is defined only by the appended claims.

Background Technology

For better understanding of the present invention, conventional technology is first described in conjunction with FIGS. 1A–1E, 2A–2E and 3A–3E.

Figure 1A:
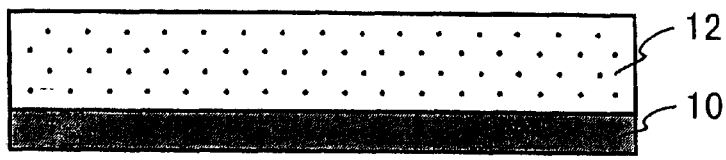
FIGS. 1A to 1E are cross-sectional views showing the steps for forming contact holes in an oxide layer, according to a conventional method.

FIGS. 1A–1E are cross-sectional views showing a conventional method for forming a contact hole. As shown in FIG. 1A, an oxide layer 12 is deposited on a silicon substrate 10 by a CVD (Chemical Vapor Deposition) technique. Hereinafter, the oxide layer 12 will be called "CVD oxide layer."

Figure 1B:
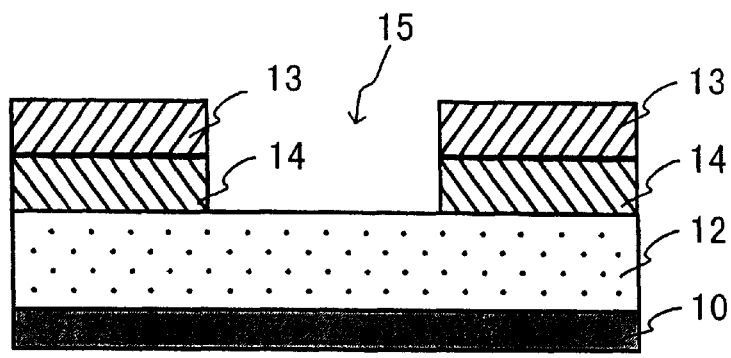

Subsequently, a polysilicon layer 14 is deposited over the entire surface of the structure by a CVD process. Next, a resist pattern 13 is formed on the polysilicon layer 14, and then the polysilicon layer 14 is etched using the resist pattern 13 as an etching mask to form an opening 15 therein, as shown in FIG. 1B. The etching process may be anisotropic etching using a halogen system gas, such as $Cl_2$ or HBr.

Figure 1C:
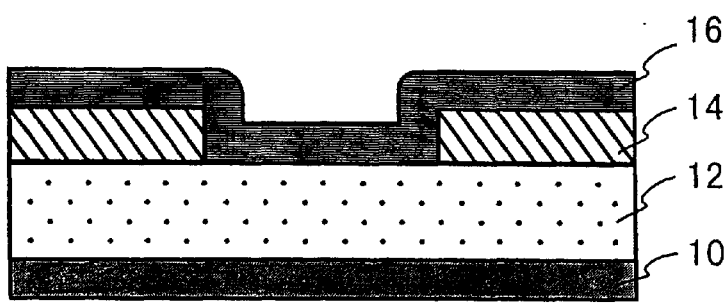
Figure 1D:
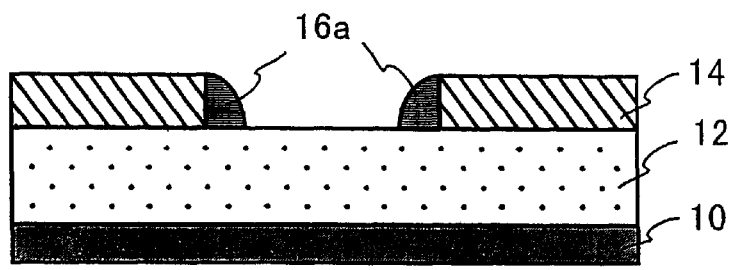

Next, the resist pattern 13 is removed, and then a polysilicon layer 16 is deposited over the entire surface of the structure, as shown in FIG. 1C. The polysilicon layer 16 is etched by an anisotropic etching process to form a sidewall 16a of polysilicon inside the opening 15, as shown in FIG. 1D. The sidewall 16a is used as a spacer or mask in the next step. That is, the CVD oxide layer 12, subsequently is etched by an anisotropic etching process using the polysilicon layer 14 and sidewall 16a as a mask to form a contact hole 17, as shown in FIG. 1E.

Figure 1E:
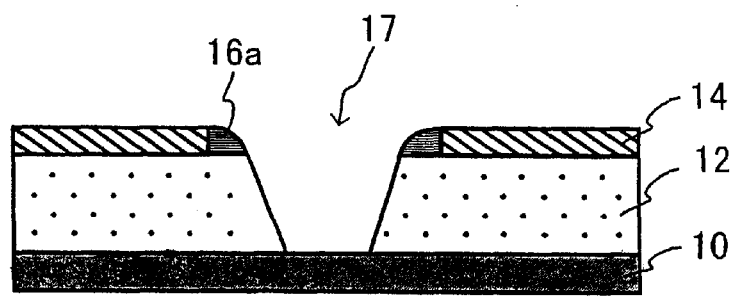

According to the above described conventional method, the contact hole 17 is tapered, having a wider opening area (diameter) at the top and a narrow opening area (diameter) at the bottom, as shown in FIG. 1E, because the etching process is of anisotropic etching. That is because the polysilicon layer 16 and sidewall 16a are etched at a etching rate determined according to the ratio of etching rates between the CVD oxide layer 12 and the polysilicon layer 16. The selectivity of the etching, which is a ratio of etching rates between the CVD oxide layer 12 and the polysilicon layer 16, is nine. For example, when the CVD oxide layer 12 is etched by 9 nm, the polysilicon layer 16 would be etched by 1 nm. The sidewall 16a is etched while the CVD oxide layer 12 is etched, so that the contact hole 17 is tapered.

Figure 2A:
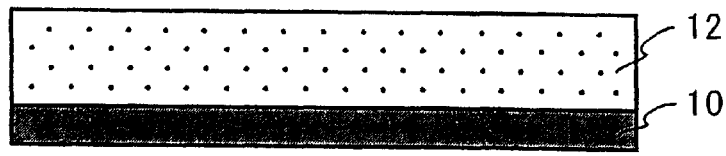
FIGS. 2A to 2E are cross-sectional views showing the steps for forming contact holes in an oxide layer, according to another conventional method.
Figure 2B:
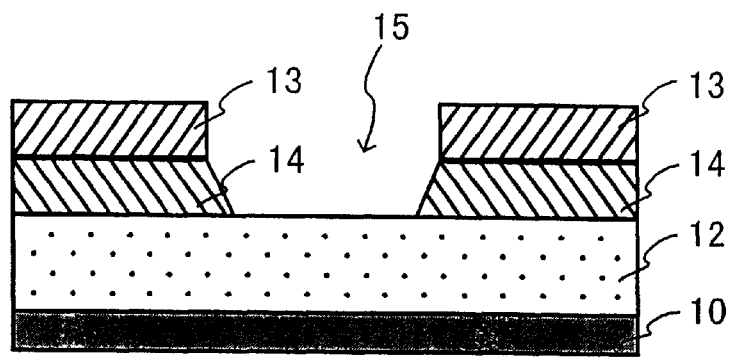

FIGS. 2A to 2E are cross-sectional views showing another conventional method for forming a contact hole. As shown in FIG. 2A, an oxide layer 12 is deposited on a silicon substrate 10 by a CVD (Chemical Vapor Deposition) technique. Next, a polysilicon layer 14 is deposited over the entire surface of the structure, shown in FIG. 2A, by a CVD process. Next, a resist pattern 13 is formed on the polysilicon layer 14, and then the polysilicon layer 14 is etched using the resist pattern 13 as an etching mask to form an opening 15 therein, as shown in FIG. 2B. The etching process may be anisotropic etching using a halogen system gas, such as $Cl_2$ or HBr.

Figure 2C:
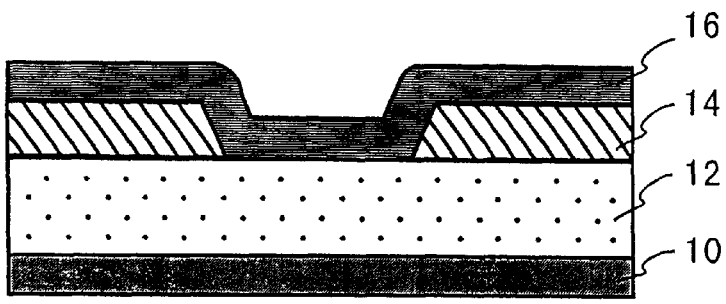
Figure 2D:
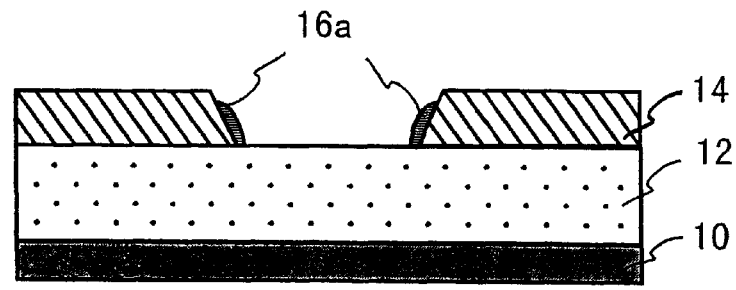

Next, the resist pattern 13 is removed, and then a polysilicon layer 16 is deposited over the entire surface of the structure, as shown in FIG. 2C. The polysilicon layer 16 is etched by an anisotropic etching process to form a sidewall 16a of polysilicon inside the opening 15, as shown in FIG. 2D. The sidewall 16a is used as a spacer or mask in the next step. The CVD oxide layer 12 is subsequently etched by an anisotropic etching process using the polysilicon layer 14 and sidewall 16a as a mask to form a contact hole 17, as shown in FIG. 2E.

Figure 2E:
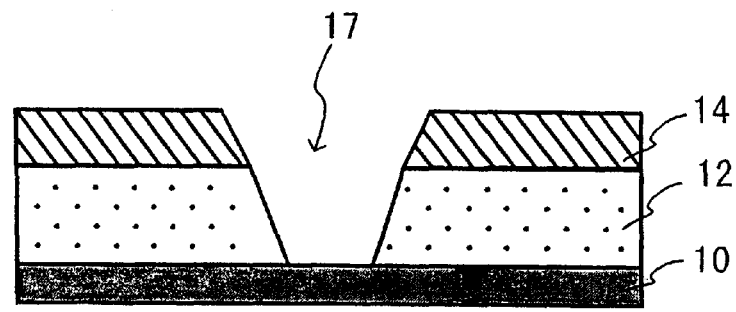

According to the above described conventional method, the contact hole 17 is tapered, having a wider opening area/diameter at the top and a narrow opening area/diameter at the bottom, as shown in FIG. 2E. In this method shown in FIGS. 2A to 2E, the polysilicon layer 14 is etched to have a tapered cross section.

Recently, as contact holes have been designed to be smaller, exhaustion characteristic of holdup gas becomes lower. Resist reaction products, including constituent elements of the resist layer, and etching reaction products, including constituent elements of the etching gas, holdup easily in the contact hole 17 (15). Such reaction products are re-attached on the inside wall of the contact hole 17 (15), so that the contact hole is over protected.

Generally, halogen system gas including Cl or Br does not react well with silicon, so that a higher bias is applied to Cl ions and Br ions in a plasma to accelerate such ions toward the semiconductor substrate. As a result, the ions are injected vertically to a polycrystalline silicon layer, and therefore, the impact power of the ions is increased. Cl radicals and Br radicals attached to the silicon layer, react with silicon with energy received from the injected ions and are removed from the substrate. In this case, the polysilicon layer is etched with the high-energy ions at a high anisotropic characteristic, and at the same time, the ions are also injected onto the resist pattern.

Resist system products, hereinafter called "resist system sputter products", generated in response to an impact of the ions and etching reaction products on the silicon layer, are deposited on the inside wall of the contact hole 17 (15). The deposited products function as a mask in the etching process, and therefore, it can be understood that the opening 15 formed in the polysilicon layer 14 is easily tapered. As shown in FIGS. 1B and 2B, the shapes of contact holes may vary even though the contact holes are formed under the same conditions of the etching process. This means that it is difficult to shape contact holes uniformly.

Figure 3A:
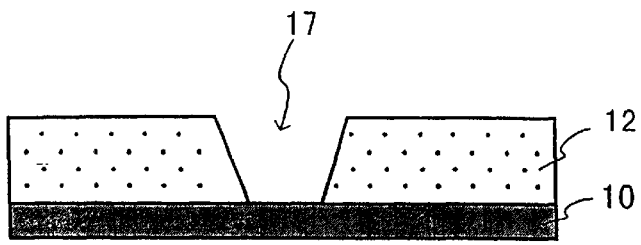
FIGS. 3A to 3E are cross sectional views showing the steps for fabricating an insulating layer (interlayer insulator film), which use the conventional methods shown in FIGS. 1A to 1E and 2A to 2E.
Figure 3B:
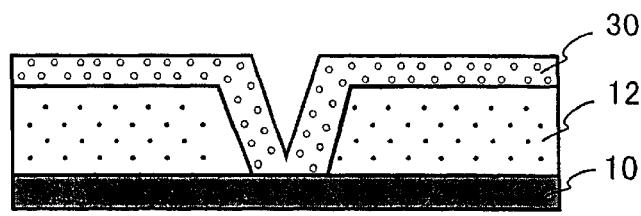
Figure 3C:
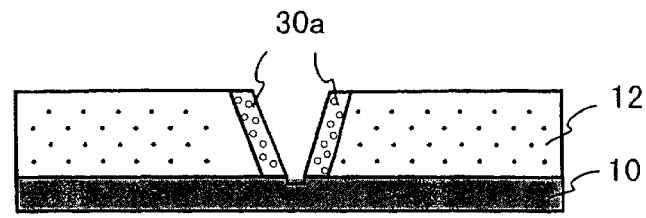

FIGS. 3A to 3E are cross sectional views showing the steps for fabricating an insulating layer (interlayer insulator film), which use the above described conventional methods. After a contact hole is formed, the polysilicon layer 14 and sidewall 16a are completely removed, as shown in FIG. 3A. Next, a titanium nitride layer is formed on the CVD oxide layer 12, and then a tungsten layer is formed on the titanium nitride layer by a CVD process to form a laminated layer 30, as shown in FIG. 3B. Subsequently, an etch-back process is carried out to the entire surface of the structure, and a tungsten plug 30a is etched at a center (bottom), so that even the silicon substrate 10 may be etched, as shown in FIG. 3C.

Figure 3D:
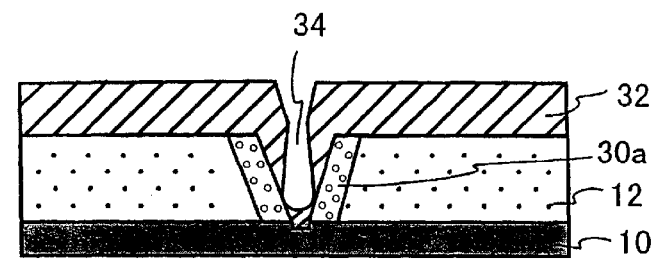

Next, an aluminum layer 32 is deposited on the surface of the structure, as shown in FIG. 3D. In this process, a cavity 34 is formed in the tungsten plug 30a. Next, the aluminum layer 32 is patterned.

Figure 3E:
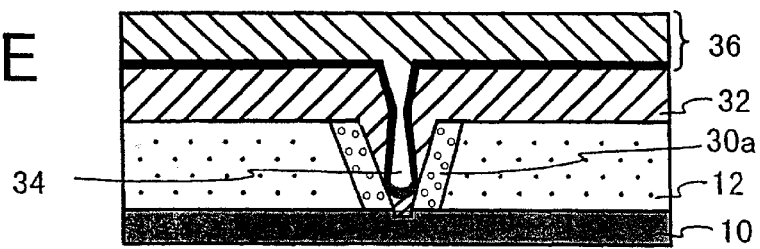

After that, an insulating layer (interlayer insulator film) 36 and a passivation film are formed on the aluminum layer 32. As shown in FIG. 3E, the cavity 34 is not filled up with the insulating layer 36. In later processes, such as thermal treatment or burn-in treatment after assembly, air in the cavity 34 expands, and therefore, the tungsten plug 30a may be broken. Such a problem makes a semiconductor device defective.

Accordingly, an object of the present invention is to provide a semiconductor device that can be fabricated at a high yield rate. Another object of the present invention is to provide an improved method for forming contact holes having inside walls that are not tapered.

First Preferred Embodiment

Now, a method according to a first preferred embodiment of the present invention is described in conjunction with FIGS. 4A to 4E, 5 and 6. In this embodiment, a dry etching technique using RF power at 13.56 MHz is used but not limited by reactive ion etching.

FIGS. 4A to 4E are cross-sectional views showing the steps for forming contact holes in an oxide layer, according to the first preferred embodiment of the present invention. In this embodiment, the same or corresponding elements to those in the conventional methods, shown in FIGS. 1A to 1E and 2A to 2E, are represented by the same reference numerals.

First, an oxide layer 12 is formed as an insulating layer on a silicon substrate 10 by a CVD process to have a thickness of 1000 nm. The oxide layer 12, hereinafter, will be called "CVD oxide layer." Next, a polysilicon layer 14 is formed on the CVD oxide layer 12 by a CVD process to have a thickness of 300 nm. After that, a resist pattern 13 is formed on the polysilicon layer 14 by a photolithography process.

Figure 4A:
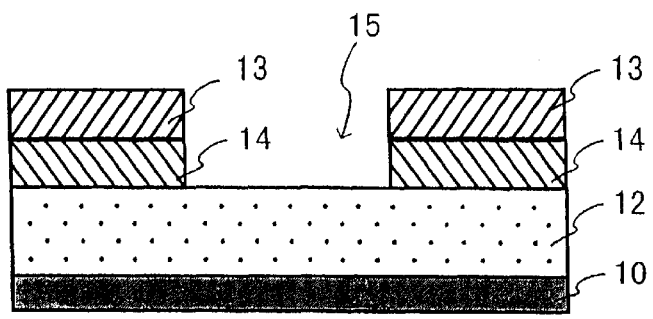
FIGS. 4A to 4E are cross-sectional views showing the steps for forming contact holes in an oxide layer, according to a first preferred embodiment of the present invention.

Subsequently, an opening 15 is formed by a first etching process, as shown in FIG. 4A to have a straight sidewall, which is not tapered. Preferably, the first etching process is carried out with an antenna type of high-density plasma etching apparatus. This type of apparatus includes an antenna coil for particular RF-power in addition to general RF-power to expand a traveling distance of electrons, which generate an inductive magnetic field in a chamber. The antenna type of apparatus improves the probability of a collision of a molecule or an atom with an electron.

The followings are conditions of the first etching process:
RF-power: 200 W
Antenna RF-power: 250 W
Flow Rate of $SF_6$: 20 sccm
Flow Rate of HBr: 80 sccm
Stage Temperature: 60□

It can be considered that the straight up sidewall is formed according to the following theory or manner:

When a gas including fluorine is mixed with a halogen system gas, including chlorine or bromine, fluorine radicals easily interact with atomic silicon even though high-energy ion bombardment occurs. That is because the diameter of the fluorine radical is smaller than that of chlorine or bromine, and therefore, fluorine radicals easily bond with atomic silicon and $SiF_2$ and $SiF_4$ is produced. As a result, a bias voltage can be reduced to generate incident ions, and therefore, a resist type of sputter products can be reduced as well.

Regarding the rate of elimination of etching reaction products, including fluorine element, the rate for SiF and $SiClF_3$ is higher than that for $SiCl_4$. Therefore, a large amount of reaction products are not deposited on the sidewall of the opening 15. Consequently, the amount of resist sputter products is reduced, and at the same time the elimination or separation rate of the reaction products is improved, so that the amount of an overprotecting film to be deposited on the sidewall of the opening 15 is reduced. In other words, according to the embodiment, the vertical processability of the contact hole 17 (opening 15) is improved.

Figure 4B:
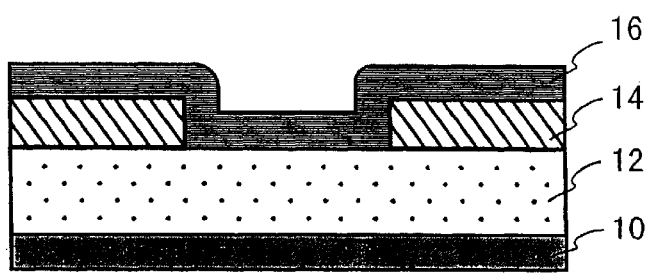
Figure 4C:
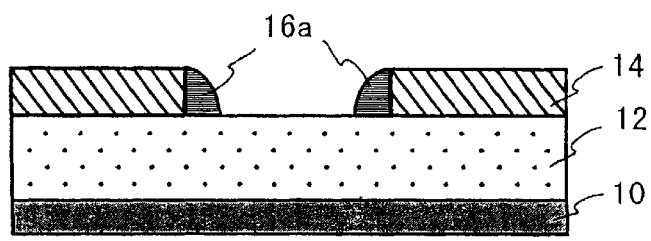
Figure 4D:
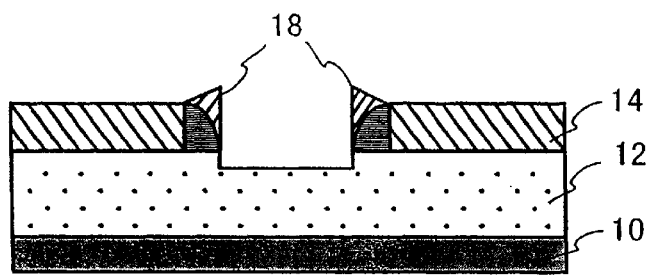
Figure 4E:
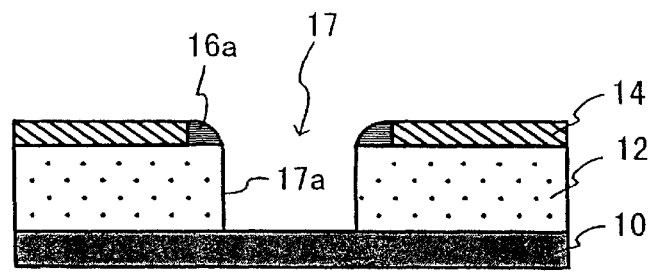
Figure 5:
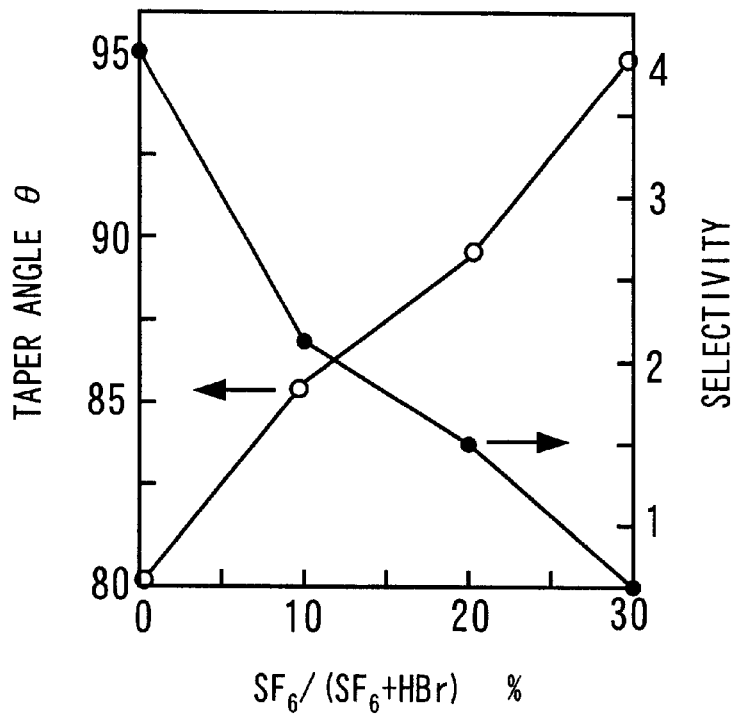
FIG. 5 is a graph showing the operation of the method according to the first preferred embodiment of the present invention, shown in FIGS. 4A to 4E.

FIG. 5 is a graph showing the operation of the method according to the first preferred embodiment of the present invention, shown in FIGS. 4A to 4E. The graph indicates the relation between the mixing rate (%) of $SF_6$ gas to HBr gas and a taper angle θ of the opening 15; and the relation between the mixing rate (%) of $SF_6$ gas to HBr gas and a selectivity of the polysilicon layer 14. The horizontal axis indicates the mixing rate (%) of $SF_6$ gas to HBr gas in the etching gas, which is calculated based on flow rate. That is, the total flow rate of the mixture gas (etching gas) is divided by the flow rate of $SF_6$ gas to obtain the mixing rate.

Figure 6:
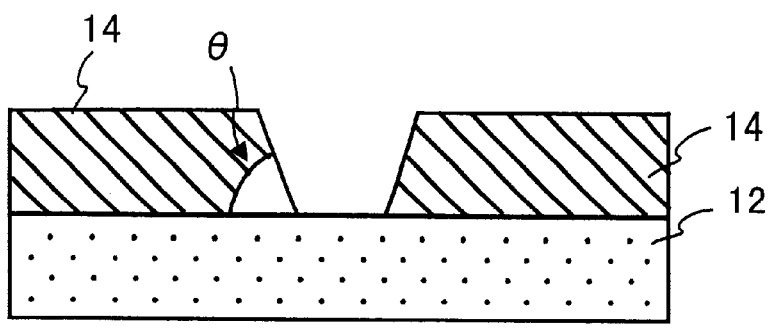
FIG. 6 is a cross-sectional view showing the operation of the method according to the first preferred embodiment of the present invention, shown in FIGS. 4A to 4E.

In the graph, void dots indicate taper angles θ shown on the left vertical axis. The taper angle θ is also shown in FIG. 6, which is the angle formed between the CVD oxide layer 12 and the sidewall of the opening 15. In the graph, black dots indicate selectivity of the polysilicon layer 14 relative to the resist layer, which is calculated by dividing an etching rate of the polysilicon layer 14 by an etching rate of the resist layer.

As understood from the graph shown in FIG. 5, when the mixing rate of $SF_6$ gas is higher, the taper angle θ becomes close to 90 degrees, but the selectivity of the polysilicon layer 14 becomes lower. Accordingly, in order to obtain an etching selectivity of more than two and a taper angle of 88 to 90 degrees, the mixing rate of $SF_6$ gas should be 15 to 20 percent. An etching gas to be mixed with $SF_6$ gas may be $Cl_2$ instead of HBr.

The condition of the first etching process is preferably as follows:
Mixing Rate of $SF_6$ gas: 15 to 20 percent
Mixing Ratio between $SF_6$ gas and $Cl_2$ or HBr: 20:80 to 15:85 (=1:4 to 1:5.7)
RF-power: 200 to 300 w
Pressure: Normal
Process Time: Depends on Thickness In the first etching process, a stage, on which the silicon substrate is put, functions as an electrode. Preferably, the stage is kept to have a temperature higher than room temperature. When the stage has a lower temperature, fluorine radicals existing in plasma, easily attach to the polysilicon layer, so that the etching rate becomes high. As a result, the etching rate is high at the bottom of the opening 15, which is impacted vertically by the ions. On the sidewall of the opening 15, attached radicals increase reaction products, and therefore, the opening 15 is tapered easily. Considering the improvement of etching rate due to low temperature of the stage and the prevention of the opening from being tapered, the stage is preferably kept to have a temperature higher than room temperature.

To prevent the CVD oxide layer 12 from being etched in the first etching process, the etching process may include two steps. In a first step, the polysilicon layer 14 is etched to a designed depth. In a second step, the polysilicon layer 14 is etched using an etching gas including oxygen for a process time corresponding to 10 to 30 percent of that of the first step. Those etching steps are carried out with the above-described antenna type etching apparatus.

First Step
RF-power: 200 W
Antenna RF-power: 250 W
Flow Rate of $SF_6$: 20 sccm
Flow Rate of HBr: 80 sccm
Stage Temperature: 60° C.

Second Step
RF-power: 200 W
Antenna RF-power: 250 W
Flow Rate of $SF_6$: 20 sccm
Flow Rate of HBr: 80 sccm
Flow Rate of $O_2$: 2 sccm
Stage Temperature: 60° C.

In the second step, oxygen gas is added to the etching gas of the first step, so that the amount of reaction between fluorine radicals and the CVD oxide layer 12 is decreased. When oxygen gas is added to the etching gas, an exposed portion of the CVD oxide layer 12 at the bottom of the opening 15 is oxidized, and the reaction products mask or cover the exposed portion. Therefore, the selectivity of the polysilicon layer 14 relative to the CVD oxide layer 12 is improved.

It is assumed that the polysilicon layer 14 is formed to have a thickness with a ten percent difference from the designed (ideal) value, so that the polysilicon layer 14 should be etched in the second step for a particular period of time that is more than ten percent of the etching period of the first step, to expose the polysilicon layer 14 sufficiently. For that reason, the second step of etching process is carried out for a period of time corresponding to 10 to 30 percent of the process time in the first step. When oxygen gas is added to the etching gas, the rate of etching rate the polysilicon layer 14 relative to the rate of etching the CVD oxide layer 12 becomes higher. The etching time of the second step is preferably less than 30 percent of the etching time of the first step.

In order to decrease the etching rate, if RF-power is decreased or the stage temperature is increased, a time for stabilizing the plasma condition would be increased and a time for heating the stage would be increased as well. As a result, the etching time becomes longer. On the other hand, even though oxygen gas is added in the etching gas, a time for stabilizing the plasma condition would not be increased and a time for heating the stage also would not be increased. Preferably, the flow rate of oxygen gas mixed with the etching gas is in a range of 1 to 3 sccm, which correspond to 1 to 3% of the total flow rate of the etching gas (mixture gas).

Next, the resist pattern 13 is removed, and then a polysilicon layer 16 (second silicon system layer) is formed thereon to have a thickness of 100 nm, as shown in FIG. 4B. After that, a second etching process is carried out to form a sidewall 16a as a spacer on the inside wall of the opening 15, as shown in FIG. 4C. The sidewall 16a makes the opening 15 have a larger diameter at the top and a smaller diameter at the bottom.

The second etching process is carried out according to the following condition:
RF-power: 300 W
Flow Rate of $Cl_2$: 30 sccm
Subsequently, a third etching process is carried out in accordance with the following conditions:
RF-power: 50 W
Flow Rate of $Cl_2$: 7 sccm
Flow Rate of HBr: 60 sccm
Flow Rate of $O_2$: 1.2 sccm
Process Time: 3 minutes When the third etching process is carried out, a reaction product 18 is formed on upper portions of the sidewall 16a, as shown in FIG. 4D. The reaction product 18 functions as a protection layer. In the third etching process, HBr gas is used as a bromine system gas. The reaction product 18 may include $SiBr_x$, which is produced by combining silicon in the polysilicon layer 14 and bromine in the etching gas with each other. In the third etching process, $Cl_2$ is used as a chlorine system gas in the etching gas. The reaction product 18 may also include $SiCl_x$ produced from silicon and chlorine. The first silicon system layer (12) and second silicon system layer (16) are of polysilicon, so that sufficient amount of silicon is provided to form the reaction product 18.

There may be two reasons that the reaction product 18 is formed on the sidewall 16a. One of them may be based on the shape of the opening 15. The opening 15 has a lower exhaustion characteristic inside thereof, so that the reaction product 18 may be formed at the upper portion of the sidewall 16a easily. Further, reaction products are oxidized with oxygen included in the etching gas, and therefore, the elimination characteristic is decreased. As a result, the etching rate is decreased as well.

Furthermore, the RF-power of the third etching process is one-fourth of the first etching process; therefore, the etching rate becomes lower. As a result, the reaction product 18 is formed on the sidewall 16a.

The third etching process may be carried out in accordance with the following conditions:
RF-power: 50 to 150 W
Flow Rate of $Cl_2$: 5 to 25 sccm
Flow Rate of HBr: 10 to 100 sccm
Flow Rate of $O_2$: 1 to 2 sccm Preferably, a ratio of flow rate between $Cl_2$ gas and HBr gas is 7:10 to 7:100 (=1:1.43 to 1:14.3); and a ratio of flow rate between $Cl_2$ gas and $O_2$ gas is 7:1 to 7:2 (=1:0.14 to 1:0.28). The total pressure may be at a conventional level, but preferably 2 to 10 Pa. The process time is determined depending on conditions including the thickness of a layer to be etched.

Next, a fourth etching process is carried out using a mask of the polysilicon layer 14, sidewall 16a and reaction product 18 to form a contact hole 17 in the CVD oxide layer 12, as shown in FIG. 4E.

The fourth etching process is carried out in accordance with the following conditions:
RF-power: 1500 W
Flow Rate of $C_4F_8$: 18 sccm
Flow Rate of Ar: 270 sccm
Flow Rate of $O_2$: 9 sccm According to the first preferred embodiment of the present invention, the reaction product 18 is formed on the sidewall 16a in the process of etching the CVD oxide layer 12, and protects the sidewall 16a. As a result, it becomes hard to etch the sidewall 16a, so that excessive etching of the portions inside the contact hole 17, which are not covered with the sidewall 16a, is prevented. Therefore, as shown in FIG. 4E, the contact hole 17 is shaped to have the straight-up inside wall 17a, which is not tapered. In other words, the contact hole 17 has a uniform diameter throughout, from the top to the bottom.

In the first preferred embodiment, HBr gas is used in the first etching process and $Cl_2$ gas is used in the second etching process, so that it is not required to provide a particular gas line to introduce such gases.

Second Preferred Embodiment

FIGS. 7A to 7E are cross-sectional views showing the steps for forming contact holes in an oxide layer, according to a second preferred embodiment of the present invention. In this embodiment, the same or corresponding elements to those in the conventional methods, shown in FIGS. 1A to 1E and 2A to 2E, and the first preferred embodiment, shown in FIGS. 4A to 4E, are represented by the same reference numerals.

Figure 7A:
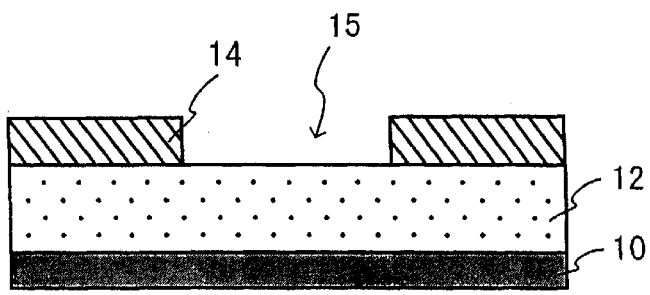
FIGS. 7A to 7E are cross-sectional views showing the steps for forming contact holes in an oxide layer, according to a second preferred embodiment of the present invention.

First, an oxide layer 12 is formed on a silicon substrate 10 by a CVD process to have a thickness of 1000 nm. The oxide layer 12, hereinafter, will be called CVD oxide layer. Next, a polysilicon layer 14 (first silicon system layer) is formed on the CVD oxide layer 12 by a CVD process to have a thickness of 300 nm. After that, an opening 15 is formed by a first etching process, as shown in FIG. 7A. The first etching process is carried out under the same conditions as the first etching process of the first preferred embodiment.

Figure 7B:
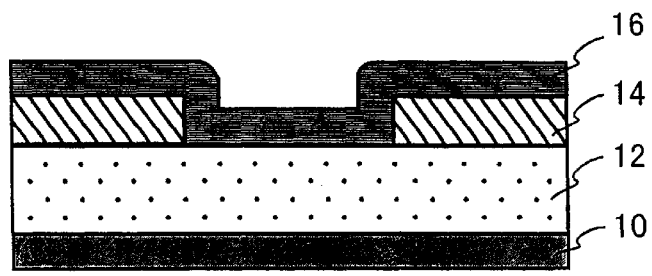
Figure 7C:
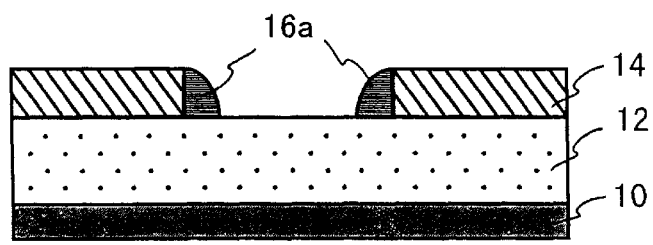

Next, a polysilicon layer 16 (second silicon system layer) is formed on the polysilicon layer 14 and in the opening 15 to have a thickness of 100 nm, as shown in FIG. 7B. After that, a second etching process is carried out to form a sidewall 16a as a spacer on the inside wall of the opening 15, as shown in FIG. 7C. The sidewall 16a is formed to have the same shape as that of the first preferred embodiment, and the second etching process is carried out under the same conditions as the second etching process in the first preferred embodiment.

Figure 7D:
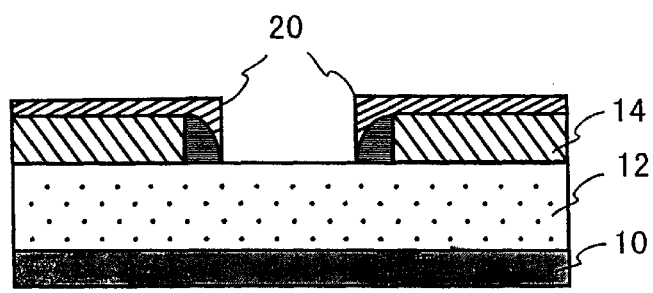

Subsequently, a third etching process is carried out in accordance with the following conditions:
RF-power: 1500 W
Flow Rate of $C_4F_8$: 20 sccm
Flow Rate of CO or Ar: 500 sccm
Process Time: 1.5 minutes When the third etching process is carried out, a reaction product 20 is formed on upper portions of the sidewall 16a and on the polysilicon layer 14, as shown in FIG. 7D. The reaction product 20 functions as a protection layer. In the third etching process, $C_4F_8$ gas is used as a fluorine system gas. The reaction product 20 may include $SiF_x$, which is produced by combining silicon in the polysilicon layer 14 and fluorine in the etching gas.

The RF-power in the third etching process is thirty times higher than in the first preferred embodiment, so that the etching reaction becomes more active. As a result, the reaction product 20 is formed not only on the sidewall 16a but also on the polysilicon layer 14. In the third etching process, silicon is physically removed by ion impact of CO or Ar, and reaction products of silicon and $SiF_x$ are formed with fluorine radicals on the polysilicon layer 14. In the fourth etching process of the first preferred embodiment, the oxygen gas decreases the rate of etching the polysilicon layer, so that no reaction products are produced even though $C_4F_8$ gas is included in the etching gas.

The third etching process may be carried out in accordance with the following conditions:

RF-power: No less than 1000 W
Flow Rate of $C_4F_8$: 10 to 40 sccm
Flow Rate of CO or Ar: 250 to 500 sccm Preferably, a ratio of flow rate between $C_4F_8$ gas and CO gas is 20:250–500(=1:12.5–25). The total pressure may be at a conventional level, but preferably not more than 13.3 Pa. The process time is determined depending on conditions including the thickness of a layer to be etched. In the third etching process, $C_4F_8$, $C_5F_8$ or $CHF_3$ may be used instead of $C_4F_8$.

Figure 7E:
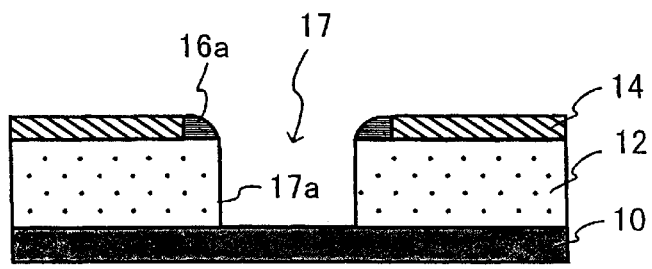

Next, a fourth etching process is carried out using the polysilicon layer 14, sidewall 16a and reaction product 20 as a mask to form a contact hole 17 in the CVD oxide layer 12, as shown in FIG. 7E. This etching process is carried out under the same conditions as those of the fourth etching process of the first preferred embodiment.

According to the second preferred embodiment, the reaction product 20 is formed not only on the sidewall 16a but also on the polysilicon layer 14, so that the reaction product 20 is formed on a wider area than the reaction product 18 of the first preferred embodiment. As a result, a lot of etching power is used for etching the reaction product 20 formed on the polysilicon layer 14; therefore, the reaction product 20 formed on the sidewall 16a is not etched so much. Thus, the etching rate of the upper portion of the sidewall 16a is decreased as compared to that in the conventional methods. Consequently, excessive etching of the portions inside the contact hole 17, which are not covered with the sidewall 16a, can be prevented. Therefore, as shown in FIG. 7E, the contact hole 17 is shaped to have the straight-up inside wall 17a, which is not tapered. In other words, the contact hole 17 has a uniform diameter throughout, from the top to the bottom.

In the second preferred embodiment, $C_4F_8$ gas and Ar gas are used in the fourth etching process, so that it is not required to provide a particular gas line to introduce such gases.

According to the first and second preferred embodiments, the opening 15 with the sidewall 16a, formed by the second etching process, has a larger diameter at the top and a smaller diameter at the bottom. Such a shape of opening is good for forming the reaction product (18 and 20) on the sidewall 16a.

Third Preferred Embodiment

FIGS. 8A to 8E are cross-sectional views showing the steps for forming contact holes in an oxide layer, according to a third preferred embodiment of the present invention. In this embodiment, the same or corresponding elements to those in the conventional methods, shown in FIGS. 1A to 1E and 2A to 2E, in the first preferred embodiment, shown in FIGS. 4A to 4E, and in the second preferred embodiments, shown in FIGS. 7A to 7E, are represented by the same reference numerals.

Figure 8A:
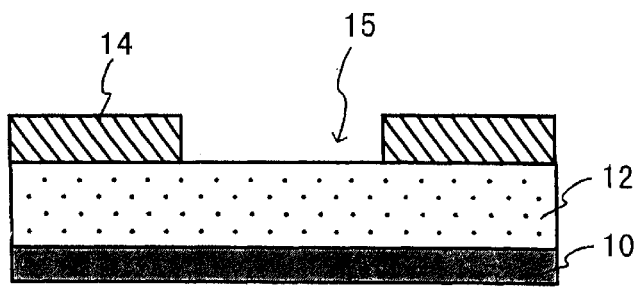
FIGS. 8A to 8E are cross-sectional views showing the steps for forming contact holes in an oxide layer, according to a third preferred embodiment of the present invention.

First, an oxide layer 12 is formed as an insulating layer on a silicon substrate 10 by a CVD process to have a thickness of 1000 nm. The oxide layer 12, hereinafter, will be called CVD oxide layer. Next, a polysilicon layer 14 (first polysilicon layer) is formed on the CVD oxide layer 12 by a CVD process to have a thickness of 300 nm. After that, an opening 15 is formed by a first etching process, as shown in FIG. 8A. The first etching process is carried out under the same conditions as those of the first etching process of the first preferred embodiment.

Figure 8B:
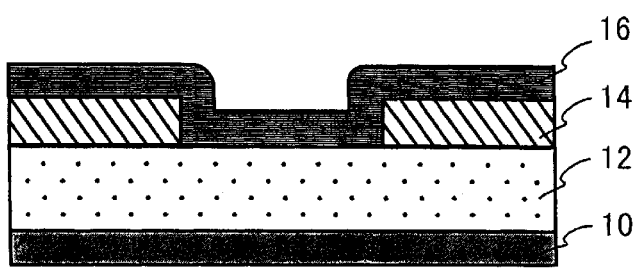

Next, a polysilicon layer 16 (second silicon system layer) is formed on the polysilicon layer 14 and in the opening 15 to have a thickness of 100 nm, as shown in FIG. 8B. The opening 15 has a larger diameter at the top and a smaller diameter at the bottom.

Figure 8C:
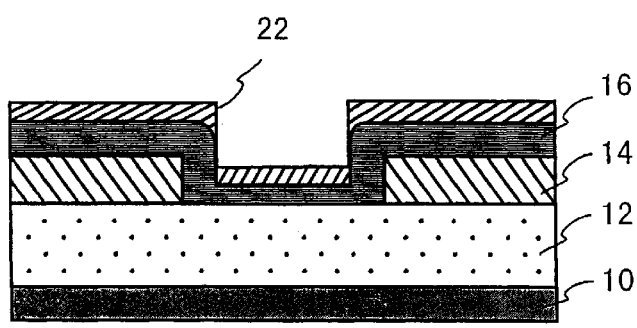

After that, a second etching process is carried out to form a reaction product 22 over the polysilicon layer 16, as shown in FIG. 8C. The reaction product 22 is formed to be thicker on a portion where the polysilicon layer 16 covers the opening 15. The second etching process is carried out under the same conditions as those of the third etching process in the second preferred embodiment. In the second etching process, silicon contained in the polysilicon layer 16 and fluorine in the etching gas may be mixed, so that $SiF_x$ is stuck on the polysilicon layer 16 to form the reaction product 22.

Figure 8D:
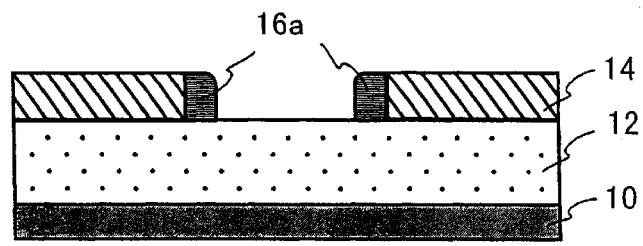

Subsequently, a third etching process is carried out to form a sidewall 16a as a spacer on the inside wall of the opening 15, as shown in FIG. 8D. The third etching process is carried out under the same conditions as those of the second etching process in the first preferred embodiment. The reaction product 22 formed on the polysilicon layer 16 is formed to have thicker portions above the sidewall 16a, so that the diameters are not much different as between the top and bottom in the opening 15, as shown in FIG. 8D, unlike the first and second preferred embodiments.

Figure 8E:
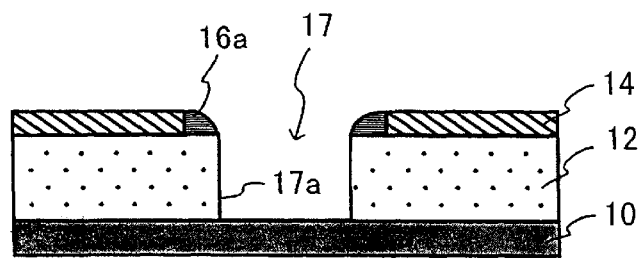

Next, a fourth etching process is carried out using the polysilicon layer 14 and sidewall 16a as a mask to form a contact hole 17 in the CVD oxide layer 12, as shown in FIG. 8E. This etching process is carried out under the same conditions as those of the fourth etching process of the first preferred embodiment.

According to the third preferred embodiment, the reaction product 22 is formed to be thicker on a portion where the polysilicon layer 16 covers the opening 15, so that the sidewall 16a is not etched so much at the top when it is being formed, as compared to the conventional methods. As a result, expansion of the contact hole 17 is prevented; and therefore, as shown in FIG. 8E, the contact hole 17 is shaped to have the straight-up inside wall 17a, which is not tapered.

Unlike the first and second preferred embodiments, components of the reaction product 22 are not floating in the etching chamber in the etching process of the CVD oxide layer 12. Therefore, the contact hole 17 is formed under clean conditions.

In the above described first to third preferred embodiments, each of the first and second silicon system layers (14 and 16) may be an α-Si layer when the etching time is optimized. The sidewall 16a is used as a mask when the contact hole 17 is formed in the CVD oxide layer 12. The first silicon system layer 14 is formed to have a thickness that allows the sidewall 16a to have enough thickness to serve as a mask. The thickness of the first silicon system layer 14 is not limited by 300 nm relative to the CVD oxide layer 12 having a thickness of 1000 nm, but can be less as long as it is more than 200 nm. The thickness of the first silicon system layer 14 is determined according to the thickness of the CVD oxide layer 12. For example, the first silicon system layer 14 can be formed to have a thickness of 150 nm when the CVD oxide layer 12 has a thickness of 500 nm.

A diameter "A" of the opening 15 in the first silicon system layer 14, a thickness "B" of the second silicon system layer 16 and a diameter "C" of the contact hole 17 in the CVD oxide layer 12 are determined to meet the following equation:

$$C=A-2B$$

Accordingly, the diameter "A" of the opening 15 in the first silicon system layer 14 and the thickness "B" of the second silicon system layer 16 can be determined freely as long as the above equation is met to obtain the diameter "C" of the contact hole 17.

Between the sidewall 16a and the opening 15, an additional layer may be inserted, such as a nitride layer. The cross-sectional shape of the contact hole 17 is not limited to being round, but may be square or the like. Although in the first to third preferred embodiment, the contact hole 17 is formed on the silicon substrate 10, the present invention can be applied to a process of forming a contact hole on a polysilicon electrode, on a metal wiring pattern, or the like.

As described above, according to the present invention, contact holes are improved in shape, namely, it is prevented that the inside wall of a contact hole is tapered. Further, the reaction products 18, 20 and 22 can be formed in a series of etching process in an etching chamber. The reaction products 18, 20 and 22 are detached and exhausted automatically in the etching process, therefore any additional process and any additional time is not required to remove the reaction products 18, 20 and 22.

What is claimed is:

1. A method for forming a contact hole, comprising the steps of:
   providing a semiconductor substrate;
   providing an insulating layer on the semiconductor substrate;
   providing a first silicon system layer on the insulating layer;
   providing a resist pattern on the first silicon system layer;
   etching the first silicon system layer using the resist pattern as a mask to form an opening in the first silicon system layer;
   removing the resist pattern;
   providing a second silicon system layer to cover the first silicon system layer and the opening;
   etching the second silicon system layer to form a spacer on an inside wall of the opening, tapered so that the opening has a larger diameter at the top and a smaller diameter at the bottom;
   providing a protection layer on the spacer; and
   etching the insulating layer using the first silicon system layer, spacer and protection layer as a mask to form a contact hole therein.

2. A method according to claim 1, wherein
   the first and second silicon system layers are of polysilicon.

3. A method according to claim 1, wherein
   the first silicon system layer is etched by a dry etching process using a mixture gas of a halogen system gas, including chlorine or bromine, and a fluorine system gas, including fluorine.

4. A method according to claim 3, wherein
   a flow ratio of the halogen system gas and fluorine system gas is determined to be 1: 4–5.7 (halogen system gas:fluorine system gas).

5. A method according to claim 3, wherein
   the first silicon system layer is etched by two etching steps of:
   (first step) performing a dry etching process using the mixture gas; and
   (second step) performing a dry etching process using the mixture gas with an oxygen gas.

6. A method according to claim 1, wherein
   the protection layer is of a reaction product produced in a dry etching process.

7. A method according to claim 6, wherein
   the protection layer is formed in a dry etching process using an etching gas that includes chlorine, bromine and oxygen.

8. A method according to claim 7, wherein
   the etching gas includes $Cl_2$ gas, including chlorine, and a HBr gas, including bromine, at a flow ratio between $Cl_2$ gas and HBr gas of 1:1.43 to 1:14.3; and a flow ratio between $Cl_2$ gas and $O_2$ gas of 1:0.14 to 1:0.28.

9. A method according to claim 6, wherein
   the protection layer is formed to cover the spacer and first silicon system layer.

10. A method according to claim 6, wherein
    the protection layer is formed in a dry etching process using an etching gas including fluorine.

11. A method according to claim 10, wherein
    the etching gas includes $C_4F_8$ gas at a flow ratio between $C_4F_8$ gas and CO or Ar gas of 1:12.5 to 1:25.

12. A method for forming a contact hole, comprising the steps of:
    providing a semiconductor substrate;
    providing an insulating layer on the semiconductor substrate;
    providing a first silicon system layer on the insulating layer;
    providing a resist pattern on the first silicon system layer;
    etching the first silicon system layer using the resist pattern as a mask to form an opening in the first silicon system layer;
    removing the resist pattern;
    providing a second silicon system layer to cover the first silicon system layer and the opening;
    providing a protection layer over the second silicon system layer;
    etching the second silicon system layer and protection layer to form a spacer on an inside wall of the opening so that the opening has an uniform diameter throughout top and bottom; and
    etching the insulating layer using the first silicon system layer and spacer as a mask to form a contact hole therein.

13. A method according to claim 12, wherein
    the first and second silicon system layers are of polysilicon.

14. A method according to claim 12, wherein
    the first silicon system layer is etched by a dry etching process using a mixture gas of a halogen system gas, including chlorine or bromine, and a fluorine system gas, including fluorine.

15. A method according to claim 14, wherein a flow ratio of the halogen system gas and fluorine system gas is determined to be 1:4–5.7 (halogen system gas-:fluorine system gas).

16. A method according to claim 14, wherein the first silicon system layer is etched by two etching steps of:
(first step) performing a dry etching process using the mixture gas; and
(second step) performing a dry etching process using the mixture gas with an oxygen gas.

17. A method according to claim 12, wherein the protection layer is of a reaction product produced in a dry etching process.

18. A method according to claim 17, wherein the protection layer is formed in a dry etching process using an etching gas that includes fluorine.

19. A method according to claim 18, wherein the etching gas includes $C_4F_8$ gas at a flow ratio between $C_4F_8$ gas and CO or Ar gas of 1:12.5 to 1:25.

20. A method for forming a contact hole, comprising the steps of:
providing a semiconductor substrate;
providing an insulating layer on the semiconductor substrate;
providing a first silicon system layer on the insulating layer;
providing a resist pattern on the first silicon system layer;
etching the first silicon system layer using the resist pattern as a mask to form an opening in the first silicon system layer;
removing the resist pattern;
providing a second silicon system layer to cover the first silicon system layer and the opening;
etching the second silicon system layer to form a spacer on an inside wall of the opening, the spacer tapered so that the opening has a larger diameter at the top and a smaller diameter at the bottom;
further etching so as to provide a reaction product that forms a protection layer on the spacer; and
etching the insulating layer using the first silicon system layer, spacer and protection layer as a mask to form a contact hole therein having vertical walls.

21. A method for forming a contact hole, comprising the steps of:
providing a semiconductor substrate;
providing an insulating layer on the semiconductor substrate;
providing a first silicon system layer on the insulating layer;
providing a resist pattern on the first silicon system layer;
etching the first silicon system layer using the resist pattern as a mask to form an opening in the first silicon system layer;
removing the resist pattern;
providing a second silicon system layer to cover the first silicon system layer and the opening;
providing a reaction product that forms a protection layer over the second silicon system layer;
etching the second silicon system layer and protection layer to form a spacer on an inside wall of the opening, so that the opening has an uniform diameter throughout top and bottom; and
etching the insulating layer using the first silicon system layer and spacer as a mask to form a contact hole therein having vertical walls.

\* \* \* \* \*